(12) United States Patent
Sube

(10) Patent No.: US 7,383,621 B2
(45) Date of Patent: Jun. 10, 2008

(54) METHOD OF PRODUCING A PIEZOELECTRIC CERAMIC

(75) Inventor: Mitsuru Sube, Yokaichi (JP)

(73) Assignee: Murata Manufacturing Co., Ltd. (JP)

( * ) Notice: Subject to any disclaimer, the term of this patent is extended or adjusted under 35 U.S.C. 154(b) by 19 days.

(21) Appl. No.: 11/415,304

(22) Filed: May 2, 2006

(65) Prior Publication Data

US 2006/0202153 A1    Sep. 14, 2006

Related U.S. Application Data

(62) Division of application No. 10/810,643, filed on Mar. 29, 2004, now abandoned.

(30) Foreign Application Priority Data

Apr. 15, 2003 (JP) .............................. 2003-109947

(51) Int. Cl.
*H01L 41/22* (2006.01)
*H01L 41/00* (2006.01)

(52) U.S. Cl. ...................... 29/25.35; 29/25.41; 29/844; 29/851; 29/832; 29/833; 310/358

(58) Field of Classification Search ............... 29/25.35, 29/25.41, 844, 851, 830, 831, 832, 833; 310/358, 310/330, 311, 332, 313 A See application file for complete search history.

(56) References Cited

U.S. PATENT DOCUMENTS

| 5,221,872 A | * | 6/1993 | Nishida et al. .............. 310/358 |
| 5,461,274 A | * | 10/1995 | Yuji et al. .................... 310/330 |
| 5,614,044 A | * | 3/1997 | Nagayama et al. ....... 156/89.12 |
| 5,771,567 A | * | 6/1998 | Pierce et al. ................. 29/600 |
| 5,908,802 A | * | 6/1999 | Voigt et al. ................ 501/134 |

FOREIGN PATENT DOCUMENTS

| JP | 2000-315827 | 11/2000 |
| JP | 2001-97769 | 4/2001 |

* cited by examiner

*Primary Examiner*—A. Dexter Tugbang
*Assistant Examiner*—Tai Nguyen
(74) *Attorney, Agent, or Firm*—Dickstein, Shapiro, LLP.

(57) ABSTRACT

A piezoelectric contains comprises a plurality of piezoelectric particles made from a piezoelectric material such as lead titanate zirconate and a dielectric made from a dielectric material, such as a composite perovskite compound, having a higher dielectric constant then the piezoelectric material, the dielectric existing in gaps between the piezoelectric particles. When poling to produce a piezoelectric ceramic, the poling is uniformly performed, and nearly all of the electric field is applied to the piezoelectric particles. Thus, the dispersion of the piezoelectric properties can be reduced, and the piezoelectric properties can be enhanced.

18 Claims, 1 Drawing Sheet

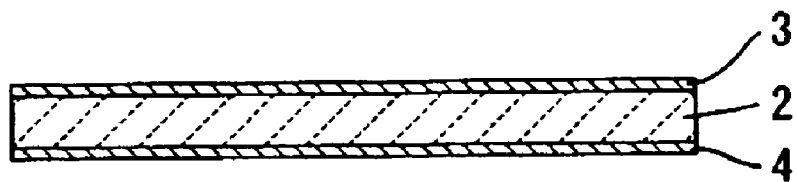
FIG. 1
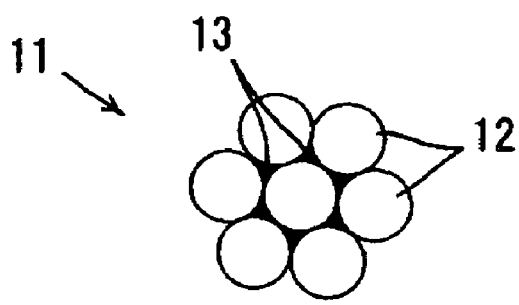
FIG. 2
FIG. 3A
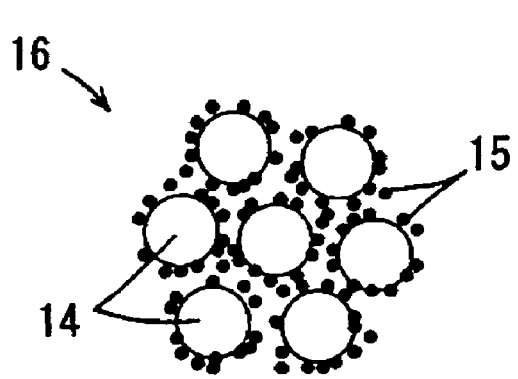
FIG. 3B
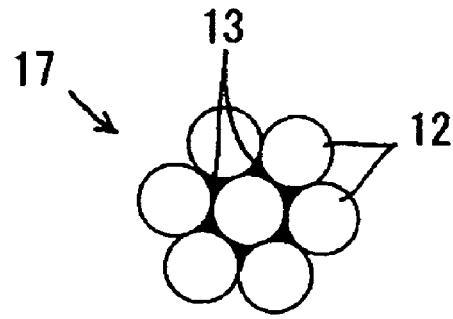

METHOD OF PRODUCING A PIEZOELECTRIC CERAMIC

This is a division of application Ser. No. 10/810,643, filed Mar. 29, 2004 now abandoned.

BACKGROUND OF THE INVENTION

1. Field of the Invention

The present invention relates to a piezoelectric ceramic, a method of producing the same, and a piezoelectric part and more particularly to a technique by which the piezoelectric properties of a piezoelectric ceramic can be enhanced and the dispersion of the piezoelectric properties can be reduced.

2. Description of the Related Art

Referring to a technique interesting to the present invention, Japanese Unexamined Patent Application Publication No. 4-295051 (Patent Document 1) describes a PZT type ceramic composition in which bismuth sodium titanate is added to a PZT type material represented by the following chemical formula: $Pb_{1.01}(Zr_{0.53}Ti_{0.47})O_3+0.5$ mol % $Nb_2O_5$ in an amount of not less than 0.5% by weight to less than 5% by weight based on 100% by weight of the PZT type material.

The known technique described in Patent Document 1 has the object of enhancing the mechanical strength of a piezoelectric ceramic without the functional characteristics of the piezoelectric ceramic being damaged. To achieve the above-described object, according to the known technique, a bismuth sodium titanate with a piezoelectric property is selected as an additive which can form a liquid phase at the same temperature as the firing temperature of the PZT type material and also has the same functional properties as those of the PZT type material. The additive is added, and forms a liquid phase when the PZT type material is fired. Thus, the PZT type material is sintered in a liquid phase.

Referring to another technique interesting to the present invention, Japanese Unexamined Patent Application Publication No. 11-87792 (Patent Document 2) describes a piezoelectric ceramic having a composite structure, in which at least two regions having different compositional ratios or different compositions exist. One of the two regions is a region in which the properties of the piezoelectric ceramic are prominent, and the other is a region in which the properties of an electrostrictive ceramic are prominent.

The known technique described in Patent Document 2 has the object of providing a piezoelectric ceramic of which the electric field-strain characteristic is controlled so as to be linear. To achieve this object, according to the known technique, materials with different piezoelectric properties are processed to form a composite. In particular, one of the materials forms a region in which the properties of a piezoelectric ceramic are prominent, and the other material forms a region in which the properties of an electrostrictive ceramic are prominent. Thereby, the piezoelectric characteristics can be easily controlled. As a result, the electric field-strain characteristic can be controlled.

However, the techniques described in Patent Documents 1 and 2 have the following problems.

According to the technique of Patent Document 1, the PZT type material to which bismuth sodium titanate is added is sintered in the liquid phase. Therefore, the PZT type material can be sintered at low temperature. However, the properties of the sintered piece may be dispersed, since the sintering is not uniform in the case of sintering in a liquid phase. Moreover, since bismuth sodium titanate has a lower dielectric constant than the PZT type material, a voltage can not be sufficiently applied to the sintered PZT type material in some cases, when the PZT type material is poled. Thus, regarding the poled piezoelectric piece, the piezoelectric properties can not be sufficiently realized in some cases.

According to the technique described in Patent Document 2, two-type regions are formed. In particular, two types of powdery materials with different composition ratios or compositions are respectively granulated. The granulated particles are mixed, formed and fired. However, when the granulated particles with different composition ratios or compositions are mixed and fired, the sintering tends to become irregular. Therefore, the piezoelectric properties are deteriorated or dispersed to a large degree in some cases.

SUMMARY OF THE INVENTION

Accordingly, it is an object of the present invention to provide a piezoelectric ceramic, a method of producing the same, and a piezoelectric part which can solve the above-described problems.

According to a first aspect of the present invention, there is provided a piezoelectric ceramic which includes a plurality of piezoelectric particles made from a piezoelectric material and a dielectric made from a dielectric material having a higher dielectric constant than the piezoelectric material, with the dielectric existing in gaps between the piezoelectric particles.

Preferably, the piezoelectric material is one of lead titanate zirconate, lead titanate, lead titanate zirconate containing a composite perovskite compound as a solid solution, and lead titanate containing a composite perovskite compound as a solid solution. Also, preferably, the dielectric material is one of a composite perovskite compound, a solid solution made from a composite perovskite compound and lead titanate, and an oxide for enhancement of a dielectric constant added to a piezoelectric material.

According to a second aspect of the present invention, there is provided a method of producing a piezoelectric ceramic which includes: a first step of calcining a powdery compound raw material for a piezoelectric material so that a calcined powder for use as the piezoelectric material is produced; a second step of calcining a powdery compound raw material for a dielectric material having a higher dielectric constant than the piezoelectric material so that a calcined powder for use as the dielectric material having a smaller particle size than the calcined powder for use as the piezoelectric material is produced; a third step of mixing the calcined powder for use as the piezoelectric material with the calcined powder for use as the dielectric material so that mixed powder is produced; a fourth step of forming the mixed powder into a predetermined shape so that a formed piece is produced; and a fifth step of firing the formed piece so that a sintered piece as a piezoelectric ceramic is produced.

In the method of the present invention, the calcined powder for use as the dielectric material preferably has a particle size which is not more than about one fourth of the particle size of the calcined powder for use as the piezoelectric material (the particle size of the calcined powder for use as the dielectric material excludes zero).

In the third step, the calcined powder for use as the dielectric material is mixed with the calcined powder for use as the piezoelectric material in an amount which is preferably not more than about 3 parts by weight based on 100 parts by weight of the calcined powder for use as the piezoelectric material (the amount of the calcined powder for use as the dielectric material excludes zero).

Moreover, the present invention is intended for a piezoelectric part which includes a major piece thereof made from the above-described piezoelectric ceramic and an external electrode formed on an outer surface of the major piece of the piezoelectric part.

As described above, a dielectric made from a dielectric material having a higher dielectric constant than a piezoelectric material exists in the gaps between a plurality of piezoelectric particles made from the piezoelectric material in the piezoelectric ceramic of the present invention. Accordingly, the whole of the piezoelectric ceramic can be uniformly poled, and nearly all of the electric field is applied to the piezoelectric particles. Thus, the dispersion of the piezoelectric characteristics can be reduced, and moreover, the piezoelectric characteristics can be enhanced.

As a result, the yield of the method of producing the piezoelectric part using the piezoelectric ceramic of the present invention is enhanced, and the production efficiency is also improved.

In the method of producing the piezoelectric ceramic of the present invention, the calcined powder for use as the dielectric material preferably has a particle size which is not more than about one fourth of the particle size of the calcined powder for use as the piezoelectric material (the particle size of the calcined powder for use as the dielectric material excludes zero). Therefore, the dispersions of the piezoelectric properties such as the resonance frequency and the anti-resonance frequency are significantly reduced.

Also, the calcined powder for use as the dielectric material is mixed with the calcined powder for use as the piezoelectric material preferably in an amount not more than about 3 parts by weight based on 100 parts by weight of the calcined powder for use as the piezoelectric material (the amount of the calcined powder for use as the dielectric material excludes zero) in the method of producing the piezoelectric ceramic of the present invention. Therefore, the piezoelectric properties such as the electromechanical coupling factor or the like are prevented from deteriorating. In some cases, piezoelectric properties can be enhanced.

BRIEF DESCRIPTION OF THE DRAWINGS

FIG. 1 is a cross-sectional view of an example of a piezoelectric part formed using the piezoelectric ceramic of the present invention;

FIG. 2 illustrates, in cross-section, the structure of the piezoelectric ceramic constituting the major piece of the electric part; and FIG. 3A and FIG. 3B illustrate an example of the method of producing a piezoelectric ceramic according to the present invention;

FIG. 3A illustrates, in a cross-section, mixed powder obtained by mixing of calcined powder for use as the piezoelectric material with calcined powder for use as the dielectric material; and FIG. 3B illustrates, in a cross section, a sintered piece obtained by forming the mixed powder into a predetermined shape and firing the formed piece.

DESCRIPTION OF THE PREFERRED EMBODIMENTS

The piezoelectric part formed using the piezoelectric ceramic of the present invention may have different structures. FIG. 1 shows an example of the piezoelectric part having the simplest structure.

A piezoelectric part 1 shown in FIG. 1 contains a sheet-shaped major piece 2 and external electrodes 3 and 4 formed on the outer faces opposite to each other of the major piece 2. The external electrodes 3 and 4 are formed by applying electro-conductive paste containing silver as an electro-conductive ingredient on the respective end faces, and baking the paste.

In the case of the piezoelectric part 1 shown in FIG. 1, the external electrodes 3 and 4 are used not only as terminals for input-output of voltage to or from the major piece 2 but also as terminals through which a DC electric field is applied to the whole of a sintered piece to be the major piece 2, resulting in production of a piezoelectric ceramic.

The piezoelectric ceramic 11 constituting the major piece 2 of the piezoelectric part 1 has a structure as shown in FIG. 2. In particular, the piezoelectric ceramic 11 comprises a plurality of piezoelectric particles 12 made from a piezoelectric material and a dielectric 13 made from a dielectric material having a higher dielectric constant than the piezoelectric material. The dielectric exists in the gaps between the piezoelectric particles 12.

For example, the above-described piezoelectric material is preferably one of lead titanate zirconate, lead titanate, lead titanate zirconate containing a composite perovskite compound as a solid solution, and lead titanate containing a composite perovskite compound as a solid solution. Preferably, the above-described dielectric material is one of a composite perovskite compound, a solid solution made from a composite perovskite compound and lead titanate, and an oxide for enhancement of a dielectric constant added to a piezoelectric material.

Preferably, the above-described piezoelectric ceramic 11 is produced as follows.

Referring to FIG. 3A, plural raw materials for a piezoelectric material are mixed to form a powdery compound raw material. The powdery compound raw material is calcined. Thus, calcined powder 14 for use as the piezoelectric material is prepared. On the other hand, plural raw materials for a dielectric material having a higher dielectric constant than the piezoelectric material are mixed to form a powdery compound raw material. Then, the powdery compound raw material is calcined. Thus, calcined power 15 for use as the dielectric material is prepared. In this case, the particle size of the calcined powder 15 for use as the dielectric material is smaller than that of the calcined powder 14 for use as the dielectric material. Preferably, the calcined powder 15 for use as the dielectric material is not more than about one fourth of the particle size of the calcined powder 14 for use as the piezoelectric material (the particle size of the calcined powder excludes 0).

Subsequently, the calcined powder 14 for the piezoelectric material is mixed with the calcined powder 15 for the dielectric material. Thus, mixed powder 16, as shown in FIG. 3A, is prepared. Preferably, not more than about 3 parts by weight of the calcined powder 15 for use as the dielectric material is mixed with 100 parts by weight of the calcined powder 14 for use as the piezoelectric material (the amount of the calcined powder 15 excludes 0) in the mixing process.

Then, the mixed powder 16 is formed in such a manner as to produce a formed piece having the same shape as that of the major piece 2 shown in FIG. 1. For the formation of the mixed powder 16, for example, a binder such as water or polyvinylalcohol is added to the mixed powder 16, and the resulting material is press-formed or the like.

Subsequently, the formed piece is fired. Thus, a sintered piece 17 as shown in FIG. 3B is formed. The sintered piece 17 has substantially the same shape as the major piece 2 shown in FIG. 2. It is to be noted that the sintered piece 17 may be abraded to have the shape identical to the major piece 2, if necessary.

Subsequently, external electrodes 3 and 4 are formed on both of the end-faces of the sintered piece 17. Thereafter, the sintered piece 17 is poled. In particular, a DC field is applied to the sintered piece 17 via the external electrodes 3 and 4. As a result, the sintered piece 17 is converted to the piezoelectric ceramic 11 shown in FIG. 2 having a piezoelectric property shown in FIG. 2. Thus, the piezoelectric part 1 containing the major piece 2 made of the piezoelectric ceramic 11 as shown in FIG. 1 is produced.

Hereinafter, Examples will be described, which were carried out to identify the operation and effects of the present invention.

EXAMPLE 1

As powdery compound raw materials for a piezoelectric material, powders of lead oxide, zirconium oxide, titanium oxide, strontium carbonate, magnesium hydroxide and chromium oxide were prepared. These powders were compounded in such amounts that lead titanate zirconate having a composition represented by the following formula: $Pb_{0.93}Mg_{0.02}Sr_{0.05}(Zr_{0.54}Ti_{0.46})O_3+0.5$ weight % $Cr_2O_3$ could be obtained. The compounded powdery compound raw materials were wet-mixed by means of a ball mill. Then, water was removed, and the powdery compound raw materials were dried and calcined at a temperature of 850 to 950° C. for 2 hours. The calcined powder was wet-crushed by means of a ball mill. Thus, a calcined powder for use as the piezoelectric material having an average particle size of 1.6 μm was formed.

As powdery compound raw materials for a dielectric material, powders of lead oxide, magnesium hydroxide and niobium oxide were prepared. The powders were compounded in such amounts that a composite perovskite compound having a composition represented by the following formula: $Pb(Mg_{1/3}Nb_{2/3})O_3$ could be formed. The compounded powdery compound raw materials were mixed by means of a ball mill. Water was removed from the mixed powder, and then the powder was calcined at a temperature of 800 to 900° C. for 2 hours. The calcined powder was wet-crushed by means of a ball mill. Thus, a calcined powder with an average particle size of 0.2 μm for use as the dielectric material was formed. In this case, the wet-mixing conditions and the calcining temperature were set so that the particle size of the calcined powder for use as the dielectric material would be smaller than that of the calcined powder for use as the piezoelectric material.

Thereafter, the calcined powder for use as the dielectric material was mixed with the calcined power for use as the piezoelectric material in amounts of 0, 0.05, 0.2, 1, 3, and 5 parts by weight, respectively, based on 100 parts by weight of the calcined powder for use as the piezoelectric material. Thus, the mixed powders to form samples 1 to 7 were produced.

Subsequently, polyvinylalcohol as a binder was added to each of the mixed powders, the composition was formed by pressing, and fired at a temperature of 1150 to 1250° C. for 2 hours. Thus, sintered pieces were produced.

Subsequently, each sintered piece was abraded to form a disk with a diameter of 10 mm and a thickness of 1 mm. External electrodes containing silver as an electroconductive ingredient were formed on both of the end-faces of the disk-shaped sintered piece by baking of electroconductive paste.

Then, the sintered piece was processed to be polarized. In particular, the sintered piece having the external electrodes formed thereon as described above was placed in insulating-oil whose temperature was maintained at 60° C. A DC electric field with an intensity of 3 kV/mm was applied between the external electrodes for 30 minutes. Thus, the entire sintered piece was poled so as to have a piezoelectric property.

As described above, piezoelectric parts each comprising the major piece made from the piezoelectric ceramic and the external electrodes were prepared and taken as samples.

Subsequently, regarding the piezoelectric part samples, the electromechanical coupling factors (Kp) with respect to vibration in the radial direction were measured. Moreover, the dispersions (CV-fr) of the resonance frequencies (fr) and the dispersions (CV-fa) of the anti-resonance frequencies (fa) of radial vibration were determined. In the above-description, CV represents an average value of the standard deviation. Table 1 shows the measurement results.

TABLE 1

| SAMPLE NO. | CALCINED POWDER FOR USE AS DIELECTRIC MATERIAL (PARTS BY WEIGHT) | Kp (%) | CV-fr (ppm) | CV-fa (ppm) |
|---|---|---|---|---|
| 1 | 0 | 42.1 | 1050 | 2030 |
| 2 | 0.05 | 43.9 | 650 | 1050 |
| 3 | 0.2 | 44.5 | 320 | 520 |
| 4 | 1 | 44.5 | 240 | 420 |
| 5 | 3 | 43.8 | 310 | 540 |
| 6 | 5 | 38.5 | 620 | 1030 |
| 7 | 5.5 | 36 | 720 | 1250 |

As seen in Table 1, the dispersions (CV-fr) of the resonance frequencies (fr) and the dispersions (CV-fa) of the anti-resonance frequencies (fa) of samples 2 to 7 containing the calcined powder for use as the dielectric material are smaller than that of sample 1 which does not contain the calcined material for use as the dielectric material.

Moreover, the electromechanical coupling factors (Kp) of the samples 2 to 5 containing not more than about 3 parts by weight of the calcined powder for use as the dielectric material based on 100 parts by weight of the calcined powder for use as the piezoelectric material are enhanced compared to those of the sample 1, which does not contain the calcined powder for use as the dielectric material and the samples 6 and 7 which contain more than about 3 parts by weight of the calcined powder for the dielectric material.

EXAMPLE 2

In Example 2, effects of the ratio of the particle sizes of the calcined powder for use as the piezoelectric material to those of the calcined powder for use as the dielectric material were investigated.

In particular, a calcined powder for use as a piezoelectric material having the same composition and average particle size, i.e., 1.6 μm of the calcined powder for use as the piezoelectric material in Example 1 was prepared. Moreover, calcined powders for use as a dielectric material having the same compositions as the calcined powder for use as the dielectric material and the average particle sizes of 0.1 μm, 0.2 μm, 0.4 μm, 0.5 μm, and 0.8 μm were prepared. Each calcined powder for use as the dielectric material was mixed with the calcined powder for use as the piezoelectric material in an amount of 1 part by weight based on 100 parts by weight of the calcined powder for use as the piezoelectric material. Thus, mixed powders were produced.

In other respects, piezoelectric parts as respective samples were produced in the same manner as those in Example 1. The measurement was carried out as in Example 1.

Table 2 shows the results. The term "particle size ratio" used in Table 2 means the ratio of the average particle size of calcined powder for use as the dielectric material to that of calcined powder for use as the piezoelectric material.

TABLE 2

| SAMPLE NO. | PARTICLE SIZE RATIO | Kp (%) | CV-fr (ppm) | CV-fa (ppm) |
|---|---|---|---|---|
| 11 | 0.0625 | 44.6 | 220 | 390 |
| 12 | 0.125 | 44.5 | 240 | 420 |
| 13 | 0.25 | 40.1 | 380 | 680 |
| 14 | 0.3125 | 37 | 420 | 860 |
| 15 | 0.5 | 30.5 | 490 | 1550 |

Sample 12 in Table 2 is the same as the sample 4 in Table 1.

As seen in Table 2, the dispersions (CV-fr) of the resonance frequencies (fr) and the dispersions (CV-fa) of the anti-resonance frequencies (fa) of samples 11 to 13 having a particle size ratio of not more than ¼ (0.25) are smaller compared to those of samples 14 and 15 having a particle size ratio of more than ¼.

EXAMPLE 3

In Example 3, powders of lead oxide, zirconium oxide, titanium oxide, strontium carbonate, magnesium hydroxide, niobium oxide, and chromium oxide were prepared as powdery compound raw materials for a piezoelectric material. Piezoelectric parts were prepared in the same manner as that in Example 1 except that these powders were compounded in such amounts that lead titanate zirconate having a composition represented by the following formula: $Pb_{0.93}Mg_{0.03}Sr_{0.05}\{(Mg_{1/3}Nb_{2/3})_{0.05}Zr_{0.49}Ti_{0.46}\}O_3+0.5$ weight % $Cr_2O_3$ could be produced, and were taken as samples. The measurement was carried out as in Example 1. Table 3 shows the results.

TABLE 3

| SAMPLE NO. | CALCINED POWDER FOR USE AS DIELECTRIC MATERIAL (PARTS BY WEIGHT) | Kp (%) | CV-fr (ppm) | CV-fa (ppm) |
|---|---|---|---|---|
| 21 | 0 | 50.9 | 650 | 1350 |
| 22 | 0.05 | 50.9 | 420 | 850 |
| 23 | 0.2 | 51.2 | 310 | 500 |
| 24 | 1 | 51.8 | 200 | 320 |
| 25 | 3 | 50.9 | 240 | 390 |
| 26 | 5 | 48.4 | 460 | 770 |
| 27 | 5.5 | 46.3 | 530 | 920 |

As seen in Table 3, the same tendency as that shown in Table 1 of Example 1 is exhibited in this Example 3.

In particular, the dispersions (CV-fr) of the resonance frequencies (fr) and dispersions (CV-fa) of the anti-resonance frequencies (fa) of samples 22 to 27 containing the calcined powder for use as the dielectric material are smaller compared to those of sample 21 not containing the calcined material for use as the dielectric material.

Moreover, the electromechanical coupling factors (Kp) of the samples 22 to 25 containing not more than about 3 parts by weight of the calcined powder for use as the dielectric material based on 100 parts by weight of the calcined powder for use as the piezoelectric material are enhanced compared to those of the samples 26 and 27 containing more than about 3 parts by weight of the calcined powder for use as the dielectric material.

EXAMPLE 4

In Example 4, piezoelectric parts were prepared in the same manner as that of Example 1 except that a solid solution as a dielectric material made from a composite perovskite compound and lead titanate, the solid solution having a composition represented by the following formula: $Pb\{(Mg_{1/3}N_{2/3})_{0.95}Ti_{0.05})O_3\}$, and were used to prepare samples. The measurement was carried out as in Example 1. Table 4 shows the results.

TABLE 4

| SAMPLE NO. | CALCINED POWDER FOR USE AS DIELECTRIC MATERIAL (PARTS BY WEIGHT) | Kp (%) | CV-fr (ppm) | CV-fa (ppm) |
|---|---|---|---|---|
| 31 | 0 | 42.1 | 1050 | 2030 |
| 32 | 0.05 | 44.1 | 560 | 950 |
| 33 | 0.2 | 44.9 | 310 | 480 |
| 34 | 1 | 45.1 | 220 | 400 |
| 35 | 3 | 44.1 | 290 | 490 |
| 36 | 5 | 39.5 | 580 | 990 |
| 37 | 5.5 | 36.5 | 690 | 1190 |

As seen in Table 4, the same tendency as that in Table 1 of Example 1 is exhibited in this Example 4.

In particular, the dispersions (CV-fr) of the resonance frequencies (fr) and the dispersions (CV-fa) of the anti-resonance frequencies (fa) of samples 32 to 37 containing the calcined powder for the dielectric material are smaller compared to those of sample 31 not containing the calcined material for use as the dielectric material.

Moreover, the electromechanical coupling factors (Kp) of the samples 32 to 35 containing not more than 3 parts by weight of the calcined powder for use as the dielectric material based on 100 parts by weight of the calcined powder for use as the piezoelectric material are enhanced compared to those of the sample 31 not containing the calcined powder for use as the dielectric material and the samples 36 and 37 which contain more than about 3 parts by weight of the calcined powder for use as the dielectric material.

EXAMPLE 5

In Example 5, piezoelectric parts were prepared in the same manner as that in Example 1 except that 0.5% by weight of $Nb_2O_3$ of an oxide for enhancement of a dielectric constant added to a piezoelectric material having a composition represented by the following formula: $Pb_{0.95}Sr_{0.05}(Zr_{0.54}Ti_{0.46})O_3$ and was used to prepare the dielectric material was used as a dielectric material, and were taken as samples. The measurement was carried out as in Example 1. Table 5 shows the results.

TABLE 5

| SAMPLE NO. | CALCINED POWDER FOR USE AS DIELECTRIC MATERIAL (PARTS BY WEIGHT) | Kp (%) | CV-fr (ppm) | CV-fa (ppm) |
|---|---|---|---|---|
| 41 | 0 | 42.1 | 1050 | 2030 |
| 42 | 0.05 | 43.9 | 860 | 1350 |
| 43 | 0.2 | 44.2 | 680 | 1150 |
| 44 | 1 | 44.2 | 580 | 870 |
| 45 | 3 | 43.5 | 670 | 1050 |
| 46 | 5 | 42.9 | 900 | 1650 |
| 47 | 5.5 | 42.3 | 940 | 1880 |

As seen in Table 5, the same tendency as that in Table 1 of Example 1 is exhibited in this Example 5.

In particular, the dispersions (CV-fr) of the resonance frequencies (fr) and the dispersions (CV-fa) of the anti-resonance frequencies (fa) of samples 42 to 47 containing the calcined powder for use as the dielectric material are smaller compared to those of sample 41 not containing the calcined material for use as the dielectric material.

Moreover, the electromechanical coupling factors (Kp) of the samples 42 to 45 containing not more than about 3 parts by weight of the calcined powder for use as the dielectric material based on 100 parts by weight of the calcined powder for use as the piezoelectric material are enhanced compared to those of the sample 31 not containing the calcined powder for use as the dielectric material and the samples 46 and 47 containing more than about 3 parts by weight of the calcined powder for use as the dielectric material.

Moreover, a dielectric material to which piezoelectric material was added was used in Example 5. Therefore, although more than about 3 parts by weight of the calcined powder for use as the dielectric material were added in the samples 46 and 47 the electromechanical coupling factors (Kp) are also prevented from decreasing in contrast to the sample 41 not containing the calcined powder for use as the dielectric material. When the dielectric powder contains a piezoelectric component, the powder is preferably used in an amount of less than 6 weight parts per 100 parts of the piezoelectric powder.

The specific Examples 1 to 5, which were carried out to identify the operation and effects of the present invention, are described hereinbefore. In Examples 1 to 5, different combinations of the piezoelectric materials and the dielectric materials were employed. In particular, the combination of lead titanate zirconate as a piezoelectric material and the perovskite compound as a dielectric material (Examples 1 and 3), the combination of lead titanate zirconate containing the composite perovskite compound as a solid solution as a piezoelectric material and the composite perovskite compound as a dielectric material (Example 2), the combination of lead titanate zirconate as a piezoelectric material and a solid solution, as a dielectric material, made from a composite perovskite compound and lead titanate zirconate (Example 4), and the combination of lead titanate zirconate as a piezoelectric material and an oxide for enhancement of a dielectric constant added to a piezoelectric material (Example 5) were employed. It has been confirmed that the same operation and effects can be also obtained by use of other combinations, piezoelectric materials.

What is claimed is:

1. A method of producing a piezoelectric ceramic comprising:
   providing a body of predetermined shape comprising a mixture of calcined piezoelectric material powder and calcined dielectric material powder, wherein said dielectric material has a higher dielectric constant than said piezoelectric material and the calcined dielectric material power has a particle size which is not more than about one fourth of the particle size of the calcined piezoelectric material powder; and
   firing the formed piece, so that a sintered piece as a piezoelectric ceramic is produced.

2. A method of producing a piezoelectric ceramic according to claim 1, further comprising forming said mixture into said predetermined shape.

3. A method of producing a piezoelectric ceramic according to claim 2, further comprising forming said mixture.

4. A method of producing a piezoelectric ceramic according to claim 3, wherein the piezoelectric powder is at least one member of the group consisting of lead titanate zirconate, lead titanate, lead titanate zirconate containing a composite perovskite compound as a solid solution therein, and lead titanate containing a composite perovskite compound as a solid solution therein.

5. A method of producing a piezoelectric ceramic according to claim 4, wherein the dielectric powder is at least one member of the group consisting of a composite perovskite compound, a solid solution of a composite perovskite compound and lead titanate, and the combination of a dielectric constant enhancement oxide and a piezoelectric material.

6. A method of producing a piezoelectric ceramic according to claim 5, wherein the dielectric content does not exceed about 3 weight parts per 100 weight parts of the piezoelectric.

7. A method of producing a piezoelectric ceramic comprising:
   providing a body of predetermined shape comprising a mixture of calcined piezoelectric material powder and calcined dielectric material powder, wherein said dielectric material has a higher dielectric constant than said piezoelectric material, and wherein the calcined dielectric material powder is present in an amount of not more than about 3 parts by weight based on 100 parts by weight of the calcined piezoelectric material powder; and
   firing the formed piece, so that a sintered piece as a piezoelectric ceramic is produced.

8. A method of producing a piezoelectric ceramic according to claim 7, further comprising forming said mixture into said predetermined shape.

9. A method of producing a piezoelectric ceramic according to claim 8, further comprising forming said mixture.

10. A method of producing a piezoelectric ceramic according to claim 9, wherein the piezoelectric powder is at least one member of the group consisting of lead titanate zirconate, lead titanate, lead titanate zirconate containing a composite perovskite compound as a solid solution therein, and lead titanate containing a composite perovskite compound as a solid solution therein.

11. A method of producing a piezoelectric ceramic according to claim 10, wherein the dielectric powder is at least one member of the group consisting of a composite perovskite compound, a solid solution of a composite perovskite compound and lead titanate, and the combination of a dielectric constant enhancement oxide and a piezoelectric material.

12. A method of producing a piezoelectric ceramic comprising:
provide a calcined piezoelectric material powder;
providing a calcined dielectric material powder, wherein said dielectric material has a higher dielectric constant than said piezoelectric material and having a particle size which is not more than about one fourth of the particle size of the calcined piezoelectric material powder;
mixing the calcined piezoelectric material powder with the calcined dielectric material powder, so that mixed powder is produced;
forming the mixed powder into a predetermined shape, so that a formed piece is produced; and
firing the formed piece, so that a sintered piece as a piezoelectric ceramic is produced.

13. A method of producing a piezoelectric ceramic according to claim 12, wherein the calcined dielectric material powder is mixed with the calcined piezoelectric material powder in an amount not more than about 3 parts by weight based on 100 parts by weight of the calcined piezoelectric material powder.

14. A method of producing a piezoelectric ceramic according to claim 13, wherein the piezoelectric powder is at least one member of the group consisting of lead titanate zirconate, lead titanate, lead titanate zirconate containing a composite perovskite compound as a solid solution therein, and lead titanate containing a composite perovskite compound as a solid solution therein.

15. A method of producing a piezoelectric ceramic according to claim 14, wherein the dielectric powder is at least one member of the group consisting of a composite perovskite compound, a solid solution of a composite perovskite compound and lead titanate, and the combination of a dielectric constant enhancement oxide and a piezoelectric material.

16. A method of producing a piezoelectric ceramic comprising:
providing a calcined piezoelectric material powder;
providing a calcined dielectric material powder, wherein said dielectric material has a higher dielectric constant than said piezoelectric material;
mixing the calcined piezoelectric material powder with the calcined dielectric material powder such that the calcined piezoelectric material powder is not more than about 3 parts by weight based on 100 parts by weight of the calcined piezoelectric material powder, so that mixed powder is produced;
forming the mixed powder into a predetermined shape, so that a formed piece is produced; and
firing the formed piece, so that a sintered piece as a piezoelectric ceramic is produced.

17. A method of producing a piezoelectric ceramic according to claim 16, wherein the piezoelectric powder is at least one member of the group consisting of lead titanate zirconate, lead titanate, lead titanate zirconate containing a composite perovskite compound as a solid solution therein, and lead titanate containing a composite perovskite compound as a solid solution therein.

18. A method of producing a piezoelectric ceramic according to claim 17, wherein the dielectric powder is at least one member of the group consisting of a composite perovskite compound, a solid solution of a composite perovskite compound and lead titanate, and the combination of a dielectric constant enhancement oxide and a piezoelectric material.

* * * * *